US011036955B2

(12) United States Patent
Nilsson et al.

(10) Patent No.: US 11,036,955 B2
(45) Date of Patent: Jun. 15, 2021

(54) FINGERPRINT SENSOR DEVICE AND METHOD FOR MANUFACTURING A SEMICONDUCTOR SENSOR DEVICE COMPRISING A COVER LAYER HAVING AN ANISOTROPIC DIELECTRIC CONSTANT

(71) Applicant: Fingerprint Cards AB, Gothenburg (SE)

(72) Inventors: Hanna Nilsson, Gothenburg (SE); Adam Benson, Kungälv (SE); Karl Lundahl, Gothenburg (SE)

(73) Assignee: Fingerprint Cards AB, Gothenburg (SE)

( * ) Notice: Subject to any disclaimer, the term of this patent is extended or adjusted under 35 U.S.C. 154(b) by 0 days.

(21) Appl. No.: 16/623,443

(22) PCT Filed: Aug. 21, 2018

(86) PCT No.: PCT/SE2018/050841
§ 371 (c)(1),
(2) Date: Dec. 17, 2019

(87) PCT Pub. No.: WO2019/039992
PCT Pub. Date: Feb. 28, 2019

(65) Prior Publication Data
US 2020/0210667 A1   Jul. 2, 2020

(30) Foreign Application Priority Data

Aug. 25, 2017   (SE) .................................. 1751020-7

(51) Int. Cl.
*G06K 9/00*   (2006.01)
*H01L 27/01*   (2006.01)

(52) U.S. Cl.
CPC ....... *G06K 9/0002* (2013.01); *G06K 9/00053* (2013.01); *H01L 27/01* (2013.01)

(58) Field of Classification Search
CPC ... G06K 9/0002; G06K 9/00053; H01L 27/01
See application file for complete search history.

(56) References Cited

U.S. PATENT DOCUMENTS 6,088,471 A   7/2000   Setlak et al.
9,547,788 B1   1/2017   Ogirko et al.
(Continued)

OTHER PUBLICATIONS

International Search Report and Written Opinion for International Application No. PCT/SE2018/050841 dated Oct. 12, 2018, 11 pages.
(Continued)

*Primary Examiner* — Premal R Patel
(74) *Attorney, Agent, or Firm* — RMCK Law Group, PLC (57) ABSTRACT

A method for manufacturing a fingerprint sensor device. The method comprises providing a fingerprint sensor chip, arranging the fingerprint sensor chip on a carrier, depositing a cover layer on the fingerprint sensor chip, the cover layer comprising a polarizable material; moving a top electrode into contact with a top surface of the cover layer; and applying a voltage between the top electrode and a bottom electrode located below the cover layer and comprised in a material stack between the bottom of the carrier and the cover layer, creating an electric field in the cover layer, thereby poling the cover layer such that a dielectric constant of the cover layer in a direction perpendicular to the sensing array is higher than a dielectric constant in a direction parallel to the sensing array, thereby forming a cover layer having an anisotropic dielectric constant.

16 Claims, 5 Drawing Sheets

(56) References Cited

U.S. PATENT DOCUMENTS

| | | | |
|---|---|---|---|
| 2004/0101994 A1 | 5/2004 | O'Brien et al. | |
| 2006/0285728 A1 | 12/2006 | Leung et al. | |
| 2013/0307818 A1* | 11/2013 | Pope | G06K 9/00053 345/174 |
| 2015/0071509 A1* | 3/2015 | Myers | G06K 9/0002 382/124 |
| 2015/0108590 A1 | 4/2015 | Alptekin et al. | |
| 2016/0188032 A1* | 6/2016 | Lin | G06K 9/0002 345/174 |
| 2016/0292488 A1* | 10/2016 | Ran | G06K 9/0002 |
| 2017/0300736 A1* | 10/2017 | Song | G06K 9/0004 |
| 2017/0372110 A1* | 12/2017 | Uehara | G06F 21/32 |
| 2018/0267666 A1* | 9/2018 | Park | G06F 3/0412 |

OTHER PUBLICATIONS

Lu, H.A. et al., "Electrical Properties and Poling of BaTiO3 thin films", Appl. Phys. Lett., vol. 64, 2973-2975 (1994), 4 pages.

* cited by examiner

FINGERPRINT SENSOR DEVICE AND METHOD FOR MANUFACTURING A SEMICONDUCTOR SENSOR DEVICE COMPRISING A COVER LAYER HAVING AN ANISOTROPIC DIELECTRIC CONSTANT

CROSS-REFERENCE TO RELATED APPLICATIONS

This application is a 371 U.S. National Stage of International Application No. PCT/SE2018/050841, filed Aug. 21, 2018, which claims priority to Swedish Patent Application No. 1751020-7, filed Aug. 25, 2017. The disclosures of each of the above applications are incorporated herein by reference in their entirety.

FIELD OF THE INVENTION

The present invention relates to a method for manufacturing a fingerprint sensor device cover layer having a heterogeneous dielectric constant.

BACKGROUND OF THE INVENTION

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices and smart cards, due to small form factor, relatively beneficial cost/performance factor and high user acceptance.

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablet computers and mobile phones, e.g. smartphones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

A typical fingerprint sensor is protected so that the fingers do not come in physical contact with the sensing elements. In particular, it may be desirable to arrange a glass plate on top of the sensor for protecting the sensor, or to arrange the sensor behind a display glass. By arranging elements between the sensing surface and the sensing elements, the distance between the sensing surface and the sensing elements increases which reduces the capacitive coupling between a finger placed on a sensing surface of the device and the capacitive sensing elements. This in turn leads to an image blurring effect. As a function of an increased distance between a finger and any given pixel, each pixel is starting to receive signals from areas that are not immediately located vertically on top of the pixel resulting in image blurring negatively impacting the capabilities of the sensors to resolve fine features in a fingerprint.

In view of the above, it is desirable to improve the capacitive coupling between a finger placed on the sensing surface and the sensing elements.

SUMMARY

In view of above-mentioned and other drawbacks of the prior art, it is an object of the present invention to provide a fingerprint sensor device providing an improved capacitive coupling between a finger and a sensing element and a method for manufacturing such a fingerprint sensor device.

According to a first aspect of the invention, there is provided a method for manufacturing a fingerprint sensor device. The method comprises: providing a fingerprint sensor chip comprising a capacitive sensing array being arranged on a first side of the fingerprint sensor chip, the sensing array comprising a plurality of electrically conductive sensing elements, the sensor device being configured to acquire an image of a finger placed on a sensing surface of the fingerprint sensor module; arranging the fingerprint sensor chip on a carrier with a second side of the fingerprint sensor chip facing the carrier, the second side being opposite of the first side; depositing a cover layer on the first side of the fingerprint sensor chip, the cover layer comprising a polarizable material; moving a top electrode into contact with a top surface of the cover layer; and applying a voltage between the top electrode and a bottom electrode located below the cover layer, creating an electric field in the cover layer, thereby poling the cover layer such that a dielectric constant of the cover layer in a direction perpendicular to the sensing array is higher than a dielectric constant in a direction parallel to the sensing array, thereby forming a cover layer having an anisotropic dielectric constant.

The sensor chip should in the present context be understood as a chip comprising a plurality of sensing elements in the form of conductive plates or pads, typically arranged in an array, which are capable of forming a capacitive coupling between each sensing element and a finger placed on an exterior surface of the fingerprint sensing device. Through readout of the capacitive coupling between each sensing element and the finger, ridges and valleys of a fingerprint can be detected as a result of the distance dependence of the capacitive coupling. To achieve a fingerprint image with sufficient resolution, the sensing elements are typically substantially smaller than the features (ridges and valleys) of the finger. In general, a chip may also be referred to as a die, a device or the like.

The cover layer is a layer of material arranged to cover and protect the fingerprint sensor chip comprising sensing array. The cover layer may be a composite material, and it may also comprise particles of varying size. Moreover, the cover layer may also be arranged to cover the sides, i.e. the edges, of the fingerprint sensor chip. The fingerprint sensor device may also comprise additional layers, on top of or below the cover layer, such as additional protection layers, passivation layers, ink layers comprising a pigment, etc.

Poling refers to the process where the polarization of a material is reoriented, in the present context in response to an electrical field applied over the polarizable material. The polarizable material is thereby a material that can be given a permanent anisotropic dielectric property by applying an external electric field (i.e. by poling). That the cover layer has an anisotropic dielectric constant means that the dielectric constant is higher in one direction across the material in comparison to the dielectric constant across another direction. In particular, to achieve the desired properties of the fingerprint sensor device, the dielectric constant is higher in the z-direction perpendicular to the sensing array than in the x and y directions in the surface plane of the sensing array. Thereby cross-talk of the capacitive coupling between the finger and the underlying sensing element can be reduced, and a higher contrast in the acquired fingerprint image can be achieved.

The cover layer may for example comprise polarizable particles consisting of only a few grains or a single grain where the individual grains can be aligned to an applied electric field. As an example, a polarizable particle having a size of approximately 1 μm may contain 1-10 grains. However, it is also possible to use a cover layer which would allow some particles to physically move in the matrix material and align themselves to the field, thereby giving the overall cover layer an anisotropic property, while the individual particles themselves not necessarily contain aligned dipoles.

The polarizable particles may for example comprise ferroelectric micrometer sized particles such as barium titanate, bismuth titanate, or similar ferroelectric materials that are mixed into a matrix material of the cover layer, which may be a compression molding material.

The present invention is based on the realization that a cover layer having an anisotropic dielectric constant can be achieved by poling the cover layer when it is in place on the sensing array, and that the bottom electrode required for poling can be integrated in the manufacturing process. Thereby, a simplified poling method is provided where the fingerprint sensor chip does not have to be removed from an assembly line or the like to pole the cover layer. Moreover, it is also possible to pole a large number of fingerprint sensor chips in parallel, such as a carrier comprising a plurality of fingerprint sensor chips. The described dielectric anisotropy can be especially beneficial in fingerprint sensor devices arranged under a thick cover glass or when very thick cover layers are required, where the signal contrast would otherwise be poor. The ability to have a package with hundreds of micrometers of material between the sensing array and the sensing surface would allow for a very mechanically robust sensor to be made.

According to one embodiment of the invention, the bottom electrode may be comprised in the material stack between the bottom of the carrier and the cover layer. Thereby, the bottom electrode is not a separate electrode located on the other side of the carrier, nor does the backside of the carrier have to act as a lower electrode.

According to one embodiment of the invention, the bottom electrode may be a metal layer integrated in the carrier. Thereby, the fingerprint sensor chip does not have to be modified to perform the described poling.

According to one embodiment of the invention, the method may further comprise arranging an adhesive conductive die attach film on the carrier and attaching the fingerprint sensor chip to the carrier by means of the adhesive conductive die attach film, the adhesive conductive die attach film thereby acting as the bottom electrode. Thereby, a material which is anyway required in the manufacturing process, i.e. the material used for attaching the fingerprint sensor chip to the carrier, can act as the bottom electrode. Thereby, the described poling can be achieved without altering the material stack of the fingerprint sensor chip.

According to one embodiment of the invention, the method may further comprise depositing a metal layer on the second side of the fingerprint sensor chip, the metal layer acting as the bottom electrode. The metal layer is advantageously deposited on the backside of the fingerprint sensor chip prior to arranging the fingerprint sensor chip on the carrier to avoid having to remove the fingerprint sensor chip from the carrier once the manufacturing process is started. However, it is in principle possible to remove the fingerprint sensor chip from the carrier to deposit the metal layer, and to thereafter either continue the manufacturing method without a carrier or to again arrange the fingerprint sensor chip on a carrier.

According to one embodiment of the invention the bottom electrode may be a metal layer integrated in the fingerprint sensor chip. Since the fingerprint sensor chip typically is manufactured using a CMOS-compatible process containing a plurality of metal layers, one of the layers may also act as a bottom electrode for poling. Such a metal layer may be a dedicated layer, or a layer which is also used for other features of the fingerprint sensor chip. One requirement of such a metal layer is that it must be possible to form an electrical connection to the bottom electrode so that a controllable potential can be provided during poling.

According to one embodiment of the invention, the bottom electrode comprises the plurality of electrically conductive sensing elements of the sensing array. Since the fingerprint sensor device already comprises an electrically conductive layer in the form of the electrically conductive sensing elements of the capacitive sensing array, this layer may be used as a bottom electrode. Moreover, since the sensing array forms the top metal layer in the fingerprint sensor device, there is no need to take lower layers into consideration with respect to how high fields they can withstand. Furthermore, the lower the distance between the top and bottom electrodes, the lower the field required for achieving the desired poling. Accordingly, using the top metal layer as bottom electrode minimizes the required field for poling.

According to one embodiment of the invention, the bottom electrode may be a homogeneous metal layer. Thereby, only one connection required to connect to the metal layer to pole the entire fingerprint sensor device. Moreover, if the bottom electrode is integrated in the carrier or located between the carrier and the fingerprint sensor device, a plurality of fingerprint sensor devices may be poled simultaneously using the same bottom electrode.

According to one embodiment of the invention, the method may further comprise heating the cover layer simultaneously to applying a voltage, thereby annealing the molding material. The cover layer may for example be a mold material deposited by means of compression molding. Such a mold material may require annealing to cure the material so that it reaches the desired material properties. Accordingly, annealing (i.e. curing) and poling can be performed in the same manufacturing step, thereby simplifying the manufacturing method. The cover layer may for example be heated by placing the fingerprint sensor device in an oven.

According to one embodiment of the invention the method may further comprise heating the top electrode simultaneously to applying a voltage, thereby annealing the cover layer. The top electrode will then act also as a heating element and as a tool for performing compression molding. Since curing of the molding layer is already an existing step in the manufacturing process, no extra step is required for poling the cover layer.

According to one embodiment of the invention, applying a voltage between the top electrode and the bottom electrodes may comprise grounding the bottom electrode and applying a voltage to the top electrode.

According to one embodiment of the invention, the method may further comprise a controlling a voltage between the top electrode and the bottom electrode such that an electric field over the fingerprint sensor chip is below 25

V/μm. Thereby, it can be avoided that the electric breakdown field strength of commonly used materials such as silicon is exceeded.

According to a second aspect of the invention, there is provided a fingerprint sensor device comprising: a fingerprint sensor chip comprising a capacitive sensing array being arranged on a first side of the fingerprint sensor chip, the sensing array comprising a plurality of electrically conductive sensing elements, the sensor device being configured to acquire an image of a finger placed on a sensing surface of the fingerprint sensor module; an electrically conductive layer configured to act as a bottom electrode; a cover layer arranged over the capacitive sensing array, the cover layer comprising a polarized material, wherein the cover layer is a poled layer having an anisotropic dielectric constant such that a dielectric constant of the cover layer in a direction perpendicular to the sensing array is higher than a dielectric constant in a direction parallel to the sensing array.

Effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

Figure 1:
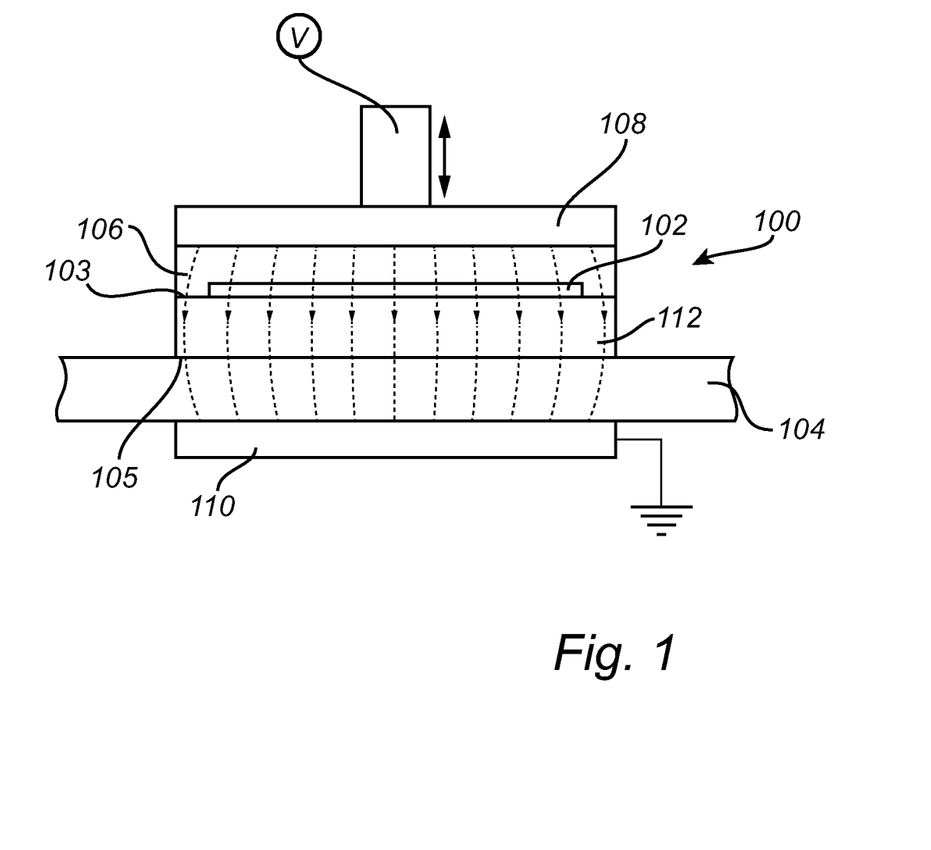
FIG. 1 schematically illustrates a fingerprint sensor device according to an embodiment of the invention.
Figure 2:
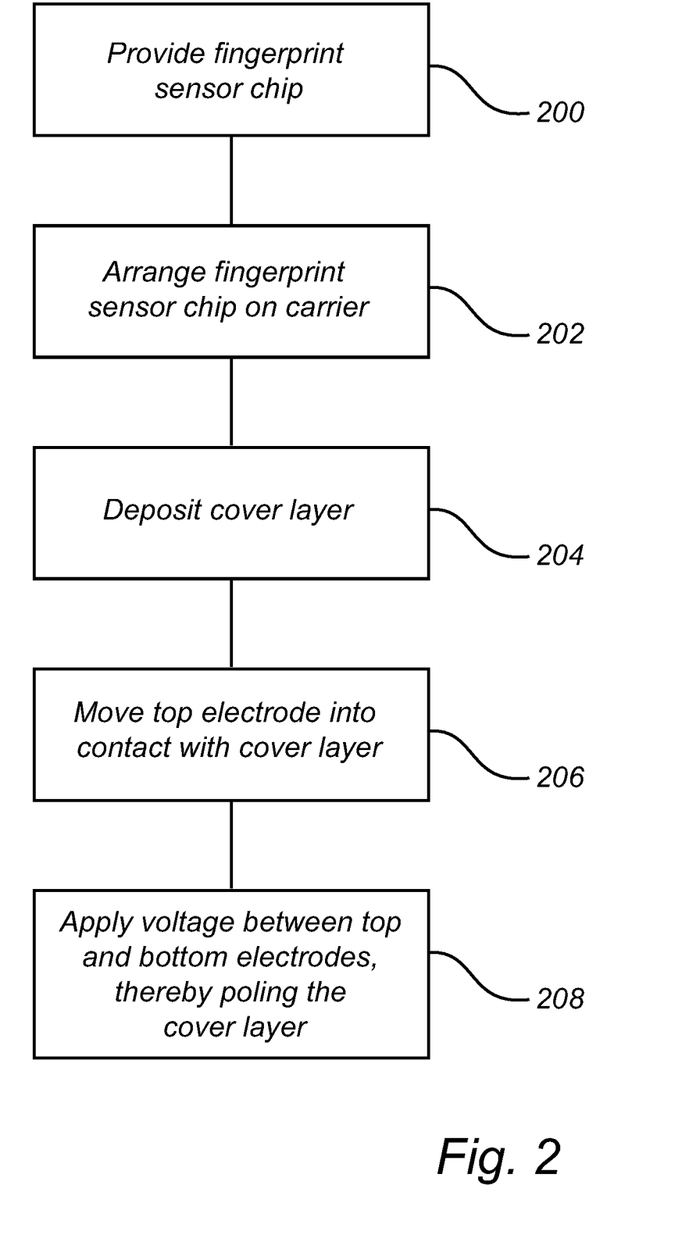
FIG. 2 is a flow chart outlining the general steps of a method according to an embodiment of the invention.

FIG. 1 schematically illustrates a fingerprint sensor device 100 according to an embodiment of the invention. FIG. 2 is a flow chart outlining the general steps of manufacturing such a fingerprint sensor device 100, and the method will be discussed with further reference to FIG. 1.

The method comprises providing 200 a fingerprint sensor chip 112 comprising a capacitive sensing array 102 being arranged on a first side 103 of the fingerprint sensor chip 112. The first side 103 may also be referred to as the top side or the active side of the fingerprint sensor chip 112. The sensing array 102 comprises a plurality of electrically conductive sensing elements. The fingerprint sensor chip 112 is further configured to acquire an image of a finger placed on a sensing surface of the fingerprint sensor device 100. The electrically conductive sensing elements, which may also be referred to as pixels, are typically arranged in an array comprising rows and columns of sensing elements. Since the technology of capacitive fingerprint sensing is well known, it will not be discussed in further detail in the present disclosure.

The method further comprises arranging 202 the fingerprint sensor chip 112 on a carrier 104 with a second side 105 of the fingerprint sensor chip 112 facing the carrier 104. The second side 105 is the opposite of the first side. The carrier 104 may be a glass wafer, a strip line carrier, a carrier plate, a printed circuit board or any other suitable carrier.

Next, a cover layer 106 is deposited 204 on the first side of the fingerprint sensor chip 112, wherein the cover layer 106 comprises a polarizable material. In the present description, the cover layer is a mold layer deposited using compression molding. However, transfer molding may also be used, and other deposition methods are also possible for other types of cover materials. The mold material may be an epoxy material having a dielectric constant between approximately 2-12.

The mold material may comprise a polarizable material in the form of ferroelectric particles consisting of e.g. barium titanate, bismuth titanate bismuth sodium titanate or potassium sodium niobate.

In the next step, the top electrode 108 is moved 206 into contact with a top surface of the cover layer 106 and a voltage is applied 208 between the top electrode 108 and the bottom electrode 110 located below the cover layer 106, creating an electric field in the cover layer 106 which cause the polarizable particles to align with the electric field. Thereby, the cover layer 106 is poled such that a dielectric constant of the cover layer in a direction perpendicular to the sensing array 102 is higher than a dielectric constant in a direction parallel to the sensing array 102, thereby forming a cover layer 106 having an anisotropic dielectric constant. After poling, the anisotropy if the cover layer is preferably above 1.2. However, it is in principle desirable with an anisotropy which is as high as possible. This means that the dielectric constant in the z direction perpendicular to the sensing array 102 is at least 20% higher than the dielectric constant in the xy-plane parallel to the sensing array 102 surface.

The electric field required in the cover layer 106 for poling the polarizable particles depends on e.g. the selected cover layer 106 material and on the nature of the polarizable particles. As an example, electric fields having a field strength in the range of a few kV/mm (V/μm) may be sufficient. Accordingly, the required voltage between the top and bottom electrodes 108, 110 depends on the location of the bottom electrode 110 in the stack and on the thickness and materials used between the electrodes 108,110. Thereby, a suitable voltage to apply between the electrodes 108,110 must be determined for a given configuration of the fingerprint sensor device 100.

The electric field should be selected such that the breakdown field in any of the layers in the fingerprint sensor device 100 material stack is not exceeded in order to avoid damaging the fingerprint sensor chip 112. The field in the material stack can also be controlled by appropriately selecting the dielectric constant of the materials in the stack. For example, the dielectric constant of the cover layer 106 before poling may be selected to be lower than the dielectric constant of silicon to avoid excessive electric fields in the fingerprint sensor chip 112.

The present invention is mainly described with reference to a capacitive fingerprint sensor device 100 where the bottom electrode 110 is maintained at ground potential during poling. It should however be noted that the described principle is applicable also for a grounded top electrode 108 and a biased bottom electrode 110. It is in principle also possible to apply a voltage on both the top and bottom electrodes 108, 110, as long as the voltage difference is such that the required field is applied across the cover layer 106.

The top electrode 108 can be the same as the tool used for compression molding, where granules or particles of the mold material are deposited on the fingerprint sensor chip. The granules are subsequently heated to form a viscous fluid for the molding. By performing poling at the same time as heating the mold material, the polarizable particles are located in a fluid which facilitates alignment of the polarizable particles to the applied field, thereby both simplifying the manufacturing process and improving the dielectric anisotropy of the resulting cover layer 106.

Figure 3:
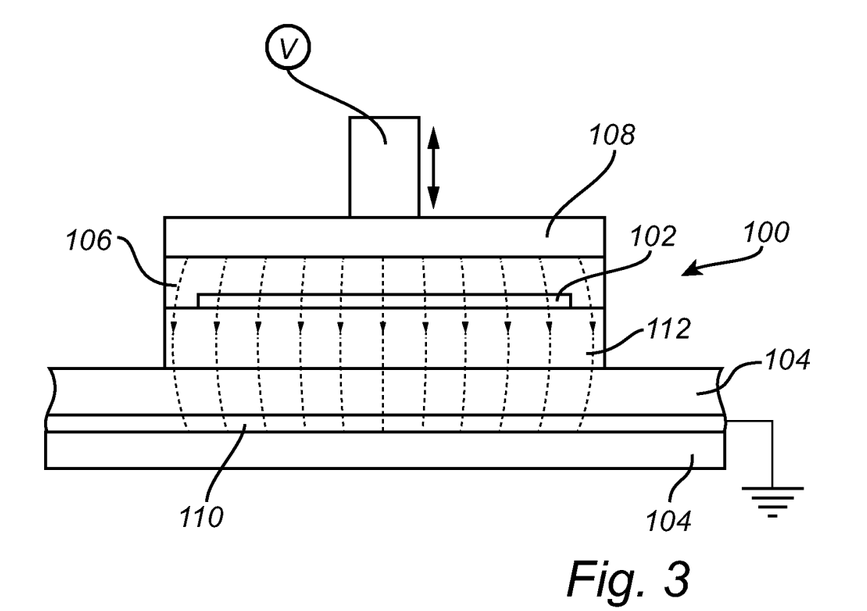
FIG. 3 schematically illustrates a fingerprint sensor device according to an embodiment of the invention.

FIG. 3 schematically illustrates an example embodiment of the fingerprint sensing device where the bottom electrode 110 is integrated in the carrier 104. The carrier may thereby be a laminated carrier such as a PCB.

Figure 4:
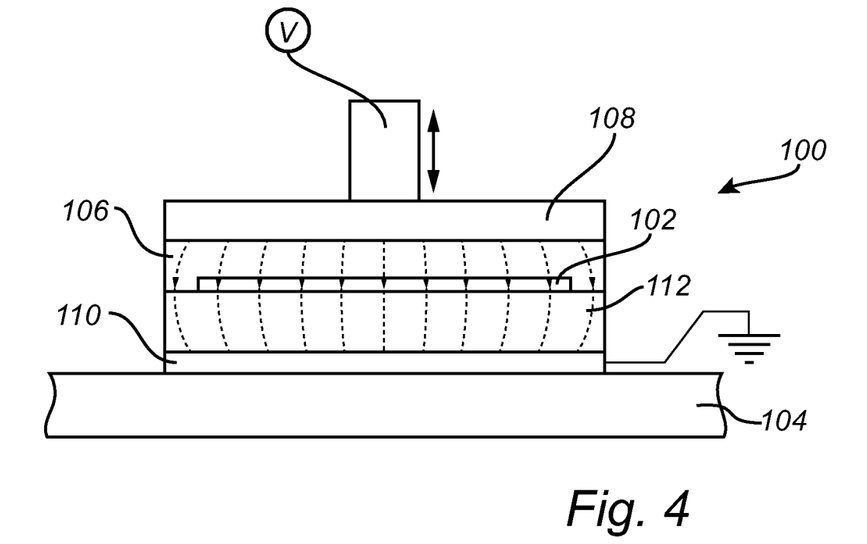
FIG. 4 schematically illustrates a fingerprint sensor device according to an embodiment of the invention.

FIG. 4 schematically illustrates an example embodiment of the fingerprint sensing device where the bottom electrode 110 is located between the carrier 104 and the fingerprint sensor chip 112. The bottom electrode 110 may be a conductive adhesive used to attach the fingerprint sensor chip 112 to the carrier 104, or the bottom electrode 110 may be a metal layer deposited on the backside of the fingerprint sensor chip 112.

Figure 5:
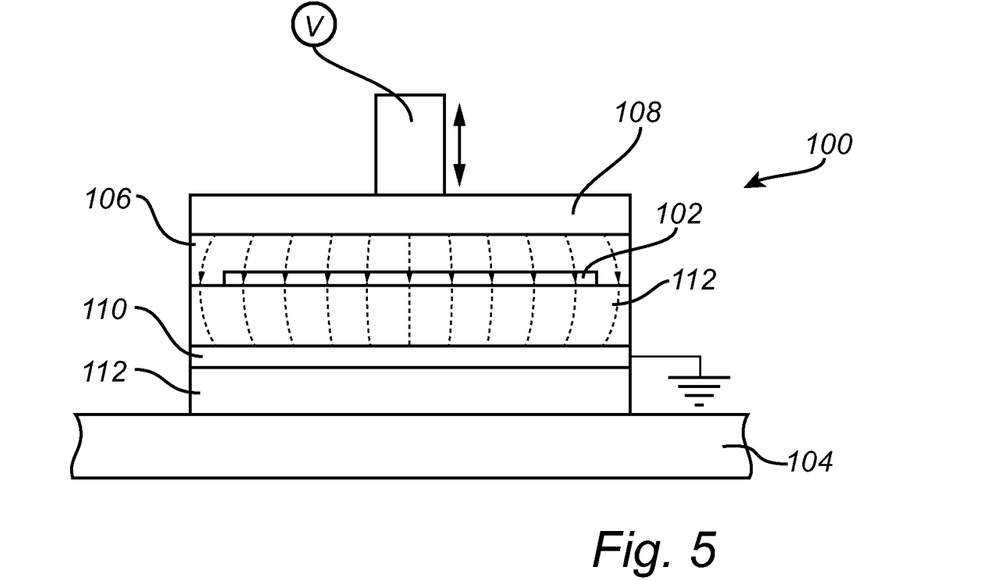
FIG. 5 schematically illustrates a fingerprint sensor device according to an embodiment of the invention.

FIG. 5 schematically illustrates an example embodiment of the fingerprint sensing device where the bottom electrode 110 is a metal layer integrated in the fingerprint sensor chip 112.

Figure 6:
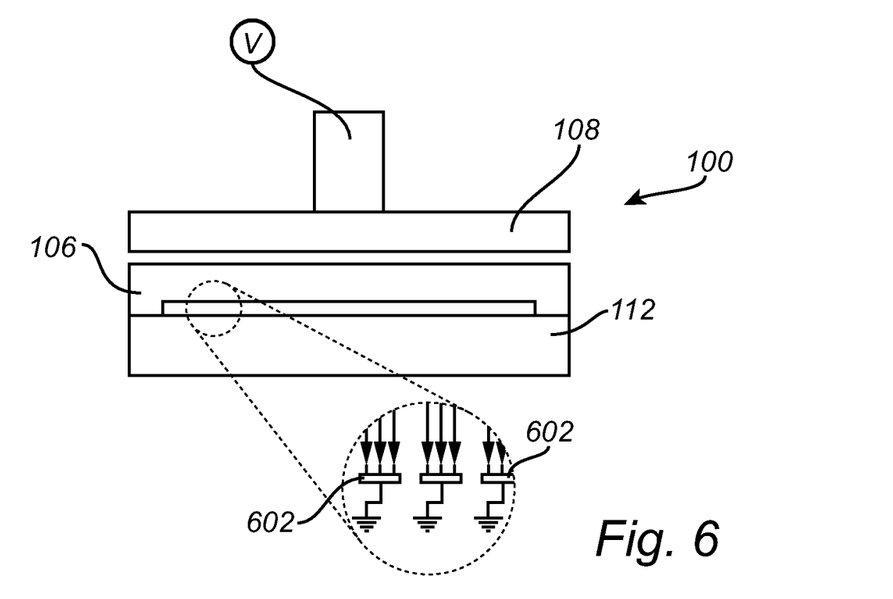
FIG. 6 schematically illustrates a fingerprint sensor device according to an embodiment of the invention.

FIG. 6 schematically illustrates an example embodiment of the fingerprint sensing device where the electrically conductive sensing elements 602 of the sensing array 102 are used as bottom electrodes. This requires that it is possible to connect each sensing element 602 to ground or to another controllable potential.

Figure 7:
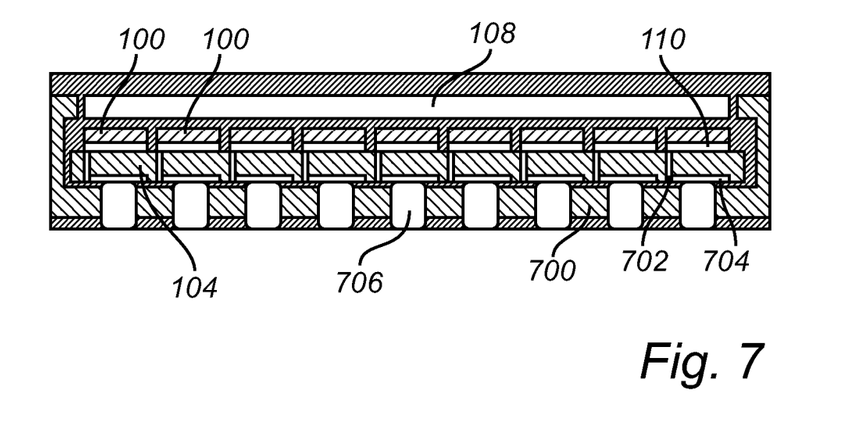
FIG. 7 schematically illustrates a fingerprint sensor device according to an embodiment of the invention.

FIG. 7 schematically illustrates a carrier 104 comprising a plurality of fingerprint sensor devices 100. Here a carrier fixture 700 is used to form the electrical connection to the bottom electrode 110, which here is located between the fingerprint sensor chip 112 and the carrier 104. The carrier 104 comprises via connections 702 connecting the bottom electrode 110 to a conductive plate 704 on the opposite side of the carrier 104. The conductive plate 704 can in turn be contacted to a connection pin 706 of the carrier fixture 700 when the carrier 104 is located in the fixture 700.

Even though the invention has been described with reference to specific exemplifying embodiments thereof, many different alterations, modifications and the like will become apparent for those skilled in the art. Also, it should be noted that parts of the method and device may be omitted, interchanged or arranged in various ways, the method and device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method for manufacturing a fingerprint sensor device, the method comprising:
   providing a fingerprint sensor chip comprising a capacitive sensing array being arranged on a first side of the fingerprint sensor chip, the sensing array comprising a plurality of electrically conductive sensing elements, the fingerprint sensor chip being configured to acquire an image of a finger placed on a sensing surface of the fingerprint sensor device;
   arranging the fingerprint sensor chip on a carrier with a second side of the fingerprint sensor chip facing the carrier, the second side being opposite of the first side;
   depositing a cover layer on the first side of the fingerprint sensor chip, the cover layer comprising a polarizable material;
   moving a top electrode into contact with a top surface of the cover layer; and
   applying a voltage between the top electrode and a bottom electrode located below the cover layer and comprised in a material stack between the bottom of the carrier and the cover layer, creating an electric field in the cover layer, thereby poling the cover layer such that a dielectric constant of the cover layer in a direction perpendicular to the sensing array is higher than a dielectric constant in a direction parallel to the sensing array, thereby forming a cover layer having an anisotropic dielectric constant.

2. The method according to claim 1, wherein the bottom electrode is a metal layer integrated in the carrier.

3. The method according to claim 1, further comprising arranging an adhesive conductive die attach film on the carrier and attaching the fingerprint sensor chip to the carrier by means of the adhesive conductive die attach film, the adhesive conductive die attach film thereby acting as the bottom electrode.

4. The method according to claim 1, further comprising depositing a metal layer on the second side of the fingerprint sensor chip, the metal layer acting as the bottom electrode.

5. The method according to claim 1, wherein the bottom electrode is a metal layer integrated in the fingerprint sensor chip.

6. The method according to claim 5, wherein the bottom electrode comprises the plurality of electrically conductive sensing elements of the sensing array.

7. The method according to claim 1, wherein the bottom electrode is a homogeneous metal layer.

8. The method according to claim 1, further comprising heating the cover layer simultaneously to applying a voltage, thereby annealing the molding material.

9. The method according to claim 1, further comprising heating the top electrode simultaneously to applying a voltage, thereby annealing the molding material.

10. The method according to claim 1, wherein applying a voltage between the top electrode and the bottom electrodes comprises grounding the bottom electrode and applying a voltage to the top electrode.

11. The method according to claim 1, further comprising a controlling a voltage between the top electrode and the bottom electrode such that an electric field over the fingerprint sensor chip is below 25 V/µm.

12. A fingerprint sensor device comprising:
a fingerprint sensor chip comprising a capacitive sensing array being arranged on a first side of the fingerprint sensor chip, the sensing array comprising a plurality of electrically conductive sensing elements, the sensor device being configured to acquire an image of a finger placed on a sensing surface of the fingerprint sensor module;
an electrically conductive layer configured to act as a bottom electrode;
a cover layer arranged over the capacitive sensing array, the cover layer comprising a polarized material, wherein the cover layer is a poled layer having an anisotropic dielectric constant such that a dielectric constant of the cover layer in a direction perpendicular to the sensing array is higher than a dielectric constant in a direction parallel to the sensing array, wherein the electrically conductive layer configured to act as a bottom electrode is comprised in a material stack between the bottom of the fingerprint sensor chip and the cover layer.

13. The fingerprint sensor device according to claim 12, wherein the electrically conductive layer configured to act as a bottom electrode is a metal layer located on a second side of the fingerprint sensor chip, the second side being opposite of the first side.

14. The fingerprint sensor device according to claim 12, wherein the electrically conductive layer configured to act as a bottom electrode is a metal layer integrated in the fingerprint sensor chip.

15. The fingerprint sensor device according to claim 12, wherein the electrically conductive layer configured to act as a bottom electrode is a homogeneous metal layer.

16. The fingerprint sensor device according to claim 12, wherein the electrically conductive layer configured to act as a bottom electrode comprises the plurality of electrically conductive sensing elements of the sensing array.

* * * * *